US006967466B2

(12) United States Patent
Koch

(10) Patent No.: US 6,967,466 B2
(45) Date of Patent: Nov. 22, 2005

(54) METHOD FOR DETERMINING THE AMOUNT OF CHARGE WHICH CAN BE DRAWN ON A STORAGE BATTERY, AND MONITORING DEVICE FOR A STORAGE BATTERY

(75) Inventor: Ingo Koch, Hameln (DE)

(73) Assignee: VB Autobatterie GmbH, Hannover (DE)

( * ) Notice: Subject to any disclaimer, the term of this patent is extended or adjusted under 35 U.S.C. 154(b) by 191 days.

(21) Appl. No.: 10/649,960

(22) Filed: Aug. 26, 2003

(65) Prior Publication Data

US 2004/0189255 A1 Sep. 30, 2004

(30) Foreign Application Priority Data

Aug. 31, 2002 (DE) .......................... 102 40 329

(51) Int. Cl.⁷ ................................ H02J 7/00
(52) U.S. Cl. ..................................... 320/132
(58) Field of Search ................. 320/131–136, 320/148–149, 151–152, 155–157, 161–164; 324/426–433

(56) References Cited

U.S. PATENT DOCUMENTS

| | | | |
|---|---|---|---|
| 3,906,329 A | | 9/1975 | Bader |
| 4,153,867 A | | 5/1979 | Jungfer et al. |
| 4,193,025 A | | 3/1980 | Frailing et al. |
| 4,207,611 A | | 6/1980 | Gordon |
| 4,322,685 A | | 3/1982 | Frailing et al. |
| 4,453,129 A | * | 6/1984 | Lissalde et al. ............. 324/429 |

(Continued)

FOREIGN PATENT DOCUMENTS

| | | |
|---|---|---|
| DE | 22 42 410 | 3/1973 |
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |

(Continued)

OTHER PUBLICATIONS

Intelec '88–Tenth International communications Energy Conference, "A look at the Impedance of a Cell—S.L. DeBardelaben, New York Telephone Company," bearing a designation "Oct. 30–Nov. 2, 1988." (6 sheets).
Battery Alert, Ltd., "The Easy–to–Install Battery Deterioration Warning Device", 12 Volt Model (BA101) Advertisement (2 sheets).

(Continued)

Primary Examiner—Michael Sherry
Assistant Examiner—Samuel Berhanu
(74) Attorney, Agent, or Firm—Foley & Lardner LLP

(57) ABSTRACT

A method for determining the amount of charge which can be drawn from a storage battery includes determining a battery voltage and current profile over at least one time interval; smoothing the battery voltage profile and the battery current profile using at least two different smoothing measures; and determining voltage and current differences between battery current and voltage profiles smoothed using a second and third smoothing measure, with the third smoothing measure producing greater smoothing than the second smoothing measure. The method further includes calculating characteristic values from quotients of the voltage differences and the current differences; utilizing the characteristic values for a time interval to determine an interval characteristic value; and determining the amount of charge which can be drawn from the storage battery from at least one interval characteristic value for at least one time interval. A monitoring device may be provided for carrying out the method.

21 Claims, 3 Drawing Sheets

U.S. PATENT DOCUMENTS

| | | | |
|---|---|---|---|
| 4,595,880 A | 6/1986 | Patil | |
| 4,642,600 A | 2/1987 | Gummelt et al. | |
| 4,659,977 A | 4/1987 | Kissel et al. | |
| 4,665,370 A | 5/1987 | Holland | |
| 4,719,427 A | 1/1988 | Morishita et al. | |
| 4,816,736 A | 3/1989 | Dougherty et al. | |
| 4,876,513 A | 10/1989 | Brilmyer et al. | |
| 4,888,716 A | 12/1989 | Ueno | |
| 4,937,528 A | 6/1990 | Palanisamy | |
| 4,943,777 A | 7/1990 | Nakamura et al. | |
| 4,952,861 A | 8/1990 | Horn | |
| 4,968,942 A * | 11/1990 | Palanisamy | 324/430 |
| 5,002,840 A | 3/1991 | Klebenow et al. | |
| 5,032,825 A | 7/1991 | Kuznicki | |
| 5,055,656 A | 10/1991 | Farah et al. | |
| 5,079,716 A | 1/1992 | Lenhardt et al. | |
| 5,130,699 A | 7/1992 | Reher et al. | |
| 5,159,272 A | 10/1992 | Rao et al. | |
| 5,162,164 A | 11/1992 | Dougherty et al. | |
| 5,204,610 A | 4/1993 | Pierson et al. | |
| 5,223,351 A | 6/1993 | Wruck | |
| 5,280,231 A | 1/1994 | Kato et al. | |
| 5,281,919 A | 1/1994 | Palanisamy | |
| 5,316,868 A | 5/1994 | Dougherty et al. | |
| 5,321,627 A * | 6/1994 | Reher | 702/63 |
| 5,352,968 A | 10/1994 | Reni et al. | |
| 5,381,096 A * | 1/1995 | Hirzel | 324/427 |
| 5,404,129 A | 4/1995 | Novak et al. | |
| 5,412,323 A | 5/1995 | Kato et al. | |
| 5,416,402 A | 5/1995 | Reher et al. | |
| 5,428,560 A | 6/1995 | Leon et al. | |
| 5,439,577 A | 8/1995 | Weres et al. | |
| 5,451,881 A * | 9/1995 | Finger | 324/433 |
| 5,488,283 A | 1/1996 | Dougherty et al. | |
| 5,549,984 A | 8/1996 | Dougherty | |
| 5,552,642 A | 9/1996 | Dougherty et al. | |
| 5,563,496 A | 10/1996 | McClure | |
| 5,572,136 A * | 11/1996 | Champlin | 324/426 |
| 5,578,915 A | 11/1996 | Crouch, Jr. et al. | |
| 5,631,540 A * | 5/1997 | Nguyen | 320/127 |
| 5,656,915 A | 8/1997 | Eaves | |
| 5,680,050 A | 10/1997 | Kawai et al. | |
| 5,698,965 A | 12/1997 | York | |
| 5,721,688 A * | 2/1998 | Bramwell | 702/63 |
| 5,744,936 A | 4/1998 | Kawakami | |
| 5,744,963 A | 4/1998 | Arai et al. | |
| 5,761,072 A * | 6/1998 | Bardsley et al. | 702/63 |
| 5,773,977 A | 6/1998 | Dougherty | |
| 5,808,367 A | 9/1998 | Akagi et al. | |
| 5,808,445 A | 9/1998 | Aylor et al. | |
| 5,818,116 A | 10/1998 | Nakae et al. | |
| 5,818,333 A | 10/1998 | Yaffe et al. | |
| 5,896,023 A | 4/1999 | Richter | |
| 5,898,292 A | 4/1999 | Takemoto et al. | |
| 5,936,383 A | 8/1999 | Ng et al. | |
| 5,965,954 A | 10/1999 | Johnson et al. | |
| 5,977,654 A | 11/1999 | Johnson et al. | |
| 5,990,660 A | 11/1999 | Meissner | |
| 6,016,047 A | 1/2000 | Notten et al. | |
| 6,037,749 A | 3/2000 | Parsonage | |
| 6,037,777 A | 3/2000 | Champlin | |
| 6,057,666 A | 5/2000 | Dougherty et al. | |
| 6,087,808 A | 7/2000 | Pritchard | |
| 6,091,325 A | 7/2000 | Zur et al. | |
| 6,118,252 A | 9/2000 | Richter | |
| 6,118,275 A | 9/2000 | Yoon et al. | |
| 6,144,185 A | 11/2000 | Dougherty et al. | |
| 6,160,382 A | 12/2000 | Yoon et al. | |
| 6,222,341 B1 | 4/2001 | Dougherty et al. | |
| 6,252,377 B1 * | 6/2001 | Shibutani et al. | 320/132 |
| 6,268,712 B1 | 7/2001 | Laig-Horstebrock et al. | |
| 6,271,642 B1 | 8/2001 | Dougherty et al. | |
| 6,296,593 B1 | 10/2001 | Gotou et al. | |
| 6,300,763 B1 | 10/2001 | Kwok | |
| 6,304,059 B1 | 10/2001 | Chalasani et al. | |
| 6,331,762 B1 | 12/2001 | Bertness | |
| 6,369,578 B1 | 4/2002 | Crouch, Jr. et al. | |
| 6,388,421 B2 | 5/2002 | Abe | |
| 6,388,450 B2 | 5/2002 | Richter et al. | |
| 6,392,389 B1 * | 5/2002 | Kohler | 320/152 |
| 6,392,414 B2 | 5/2002 | Bertness | |
| 6,392,415 B2 * | 5/2002 | Laig-Horstebrock et al. | 324/433 |
| 6,417,668 B1 | 7/2002 | Howard et al. | |
| 6,424,157 B1 | 7/2002 | Gollomp et al. | |
| 6,441,585 B1 | 8/2002 | Bertness | |
| 6,445,158 B1 | 9/2002 | Bertness et al. | |
| 6,452,361 B2 | 9/2002 | Dougherty et al. | |
| 6,472,875 B1 | 10/2002 | Meyer | |
| 6,495,990 B2 * | 12/2002 | Champlin | 320/132 |
| 6,507,194 B2 | 1/2003 | Suzuki | |
| 6,515,452 B2 | 2/2003 | Choo | |
| 6,515,456 B1 | 2/2003 | Mixon | |
| 6,522,148 B2 | 2/2003 | Ochiai et al. | |
| 6,534,992 B2 | 3/2003 | Meissner et al. | |
| 6,556,019 B2 | 4/2003 | Bertness | |
| 6,600,237 B1 | 7/2003 | Meissner | |
| 6,600,293 B2 | 7/2003 | Kikuchi | |
| 6,608,482 B2 | 8/2003 | Sakai et al. | |
| 6,653,818 B2 | 11/2003 | Laig-Horstebrock et al. | |
| 2002/0008495 A1 | 1/2002 | Dougherty et al. | |
| 2002/0026252 A1 | 2/2002 | Wruck et al. | |
| 2002/0031700 A1 | 3/2002 | Wruck et al. | |
| 2003/0047366 A1 | 3/2003 | Andrew et al. | |
| 2003/0082440 A1 | 5/2003 | Mrotek et al. | |
| 2003/0142228 A1 | 7/2003 | Flach et al. | |
| 2003/0236656 A1 | 12/2003 | Dougherty | |
| 2004/0021468 A1 | 2/2004 | Dougherty et al. | |

FOREIGN PATENT DOCUMENTS

| | | |
|---|---|---|
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Journal of Applied Electrochemistry, vol. 10 No. 1, Jan. 1980–The Impedance of Electrical Storage Cells–N.A. Hampson, s.A.G.R. Karunathilaka, Department of Chemistry, R. Leek, Department of Electronic and Electrical Engineering, University of Technology, Loughborough, Lieces-tershire, UK (11 sheets).

Battery Evaluation Reports, s.e. Ross Laboratories, Inc., Apr. 1999 (1 page).

HSR–003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pgs. http://www.cotorelay.com/ReedTech.pdf, available at least by Jan. 6, 2003; 37–43.

Willibert Schleuter, *Das elektrische Ersatzschaltbild des Bleiakkumulators unter Berücksichtigung erzwungener Elektrolyyströmung*, etz Archiv, vol. 4 (1982), Issue 7, pp. 213–218.

Lürkens et al., *Ladezustandsschätzuntt von Bleibatterien mit Hilfe des Kalman–Filters*, etz Archiv, vol. 8 (1986), Issue 7, pp. 231–236.

Brooke, L., "Resin Keeps Batteries Cool", A1 Inside Magazine, Nov. 1998, p. 55.

Hoover, J., "Failure Modes of Batteries Removed from Service", A Presentation at the 107th Convention of Battery Council International, Apr. 30–May 3, 1995, p. 62.

Stan Gibilisco and Neil Sclater, Co–Editors–in–Chief, "Rectifier Bridge," Encyclopedia of Electronics, 2nd Edition, TAB Professional and Reference Books, 1996, pp. 708–711.

Lehman, A., "Electrical Battery Model For Leo Application Based on Absolute Instantaneous State of Charge," Proceedings of the European Space Power Conference held in Madrid, Spain, Oct. 2–6, 1989, ESA Publications, NL, vol. 1, pp. 173–178.

Robbins, Tim & Hawkins, John, "Battery Model For Over–Current Protection Simulation of DC Distribution Systems," Telecommunications Energy Conference, 1994, Intelec '94, 16th International Vancouver, BC, Canada Oct. 30–Nov. 3, 1994, New York, NY, IEEE, pp. 307–314 XP001036407 ISBN: 0-7803-2034-4.

Mayer, D. et al., "Modelling and Analysis of Lead Acid Battery Operation," Ecole des Mines de Paris, XP010092137, pp. 1–3.

Mauracher, P. & Karden, E., "Dynamic Modelling of Lead/Acid Batteries Using Impedance Spectoscopy for Parameter Identification," Journal of Power Sources, Elsevier Sequoia S.A., Lausanne, Ch., vol. 67 (1997) No. 1–2, pp. 69–84, XP004095174 ISSN: 0378-7753, p. 70, line 11; p. 82, line 5, figures 2, 3, 12.

Baert, D & Vervaet, A., "Lead–Acid Battery Model for the Derivation of Peukert's Law," Electrochimica Acta, Elsevier Science Publishers, Barking, GB, vol. 44, No. 20, pp. 3491–3504 XP004168624 ISSN: 0013-4686.

Internatioal Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19–22, 1986." (6 sheets).

Bosch and the New E–Class, Electronic Battery Management System, Focus on Electronics, Nov. 2002 (1 sheet).

Forecast Review, The Battery Man, Nov., 1996 p. 21.

OnGuard™ XT Battery State–of–Health Monitor, 2003 Midtronics, Inc. P/N 156–983A (2 sheets).

* cited by examiner

METHOD FOR DETERMINING THE AMOUNT OF CHARGE WHICH CAN BE DRAWN ON A STORAGE BATTERY, AND MONITORING DEVICE FOR A STORAGE BATTERY

CROSS-REFERENCE TO RELATED PATENT APPLICATIONS

Germany Priority Application DE 102 40 329.5, filed Aug. 31, 2002 including the specification, drawings, claims and abstract, is incorporated herein by reference in its entirety.

BACKGROUND OF THE INVENTION

The invention relates to a method for determining the amount of charge which can be drawn from a storage battery. The invention also relates to a monitoring device for a storage battery having measurement means for measurement of battery voltages and battery currents, and also having evaluation means.

It may be desirable to estimate the amount of charge which can be drawn from a storage battery during operation.

U.S. Pat. No. 5,761,072 describes a method for determining the capacity of a storage battery for this purpose, in which a filter is used to determine a fast current and a slow current is determined by averaging by means of integration. The values for the fast and slow current are entered in what is referred to as a Peukert relationship in order to determine a capacity for a fast current and for a slow current. These capacities are weighted, and are used to calculate a total capacity.

DE 694 23 918 T2 describes an apparatus for indicating the extent to which a battery is empty, in which measurement values of, for example, the no-load voltage or internal impedance are recorded periodically. These measurement values are filtered via a low-pass filter, and their mean value is determined. If the mean value exceeds a threshold value, an empty warning indication is produced.

DE 691 31 276 T2 discloses an electronic tester for assessing the percentage energy capacity of a battery or of a battery cell. In this method, the dynamic conductance is determined and is compared to a reference conductance, which corresponds to the dynamic conductance of a battery or battery cell with a 100 percent capacity.

These previously known methods and apparatuses may be used to determine the state of charge of a new battery. However, such methods may be desirable for determining the amount of charge which can still be drawn from a used battery, particularly at low current levels.

One difficulty is that the amount of charge which can be drawn from a fully charged storage battery can decrease for various reasons (i.e., it may no longer be possible to draw the same amount of charge from a used storage battery as for a battery in a new state). These reasons may, for example in the case of lead-acid rechargeable batteries, be the loss of active material due to precipitant formation, sulfatation, or the like.

If, by way of example, the state of charge of a storage battery is determined by measuring the no-load voltage, as is possible for example in the case of a lead-acid rechargeable battery, then it is not possible to use this value to make any statement about the amount of charge $Q_R$ which can still be drawn from the fully charged storage battery when it is no longer new. The reason for this is that, although the state of charge is a measure of the amount of charge which can be drawn from the acid in this case, the amount of charge which can still be drawn from the active material is not correlated with the amount of charge in the acid when new.

If the state of charge (SOC) is defined as the quotient of the difference between the nominal amount of charge and the amount of charge drawn with respect to the nominal amount of charge, $$SOC = \frac{\text{Nominal amount of charge} - \text{Amount of charge drawn}}{\text{Nominal amount of charge}}$$

then the state of charge (SOC) likewise does not provide any information about the amount of charge $Q_R$ which can be drawn.

Based on this definition, the state of charge provides no information about the actual amount of charge $Q_R$ which can be drawn from a used storage battery.

U.S. Pat. No. 5,721,688 and U.S. Pat. No. 5,572,136 disclose apparatuses and methods in which a relatively small current which varies with time is applied to a storage battery, and the time-dependent voltage response of the storage battery is observed and evaluated. The conductivity of the storage battery can be determined from the voltage response. However, during operation, it is not always desirable or possible to apply a separate measurement current.

There is thus a need for an improved method for determining the amount of charge $Q_R$ which can be drawn from a storage battery in the fully charged state. There is also a need for a monitoring device for a storage battery, by means of which it is possible to determine as accurately as possible the amount of charge $Q_R$ which can be drawn from a used storage battery, using relatively simple means.

SUMMARY OF THE INVENTION

An exemplary embodiment relates to a method for determining the amount of charge which can be drawn from a storage battery. The method includes determining a battery voltage profile and a battery current profile over at least one time interval and smoothing the battery voltage profile and the battery current profile using at least two different smoothing measures. The method also includes determining voltage differences between the battery voltage profile smoothed using a second smoothing measure and the battery voltage profile smoothed using a third smoothing measure, with the third smoothing measure producing greater smoothing than the second smoothing measure. The method further includes determining the current differences between the battery current profile smoothed using a second smoothing measure and the battery current profile smoothed using a third smoothing measure, with the third smoothing measure producing greater smoothing than the second smoothing measure. The method further includes calculating characteristic values from quotients of the voltage differences and the current differences, utilizing the characteristic values for a time interval to determine an interval characteristic value, and determining of the amount of charge which can be drawn from the storage battery from at least one interval characteristic value for at least one time interval.

Another exemplary embodiment relates to a monitoring device for a storage battery. The monitoring device includes a measurement component for measuring battery voltages and battery currents and an evaluation component. The evaluation component designed to carry out a method that includes determining a battery voltage profile and a battery current profile over at least one time interval and smoothing the battery voltage profile and the battery current profile using at least two different smoothing measures. The method also includes determining voltage differences between the battery voltage profile smoothed using a second smoothing measure and the battery voltage profile smoothed using a third smoothing measure, with the third smoothing measure producing greater smoothing than the second smoothing measure. The method further includes determining the current differences between the battery current profile smoothed using a second smoothing measure and the battery current profile smoothed using a third smoothing measure, with the third smoothing measure producing greater smoothing than the second smoothing measure. The method further includes calculating characteristic values from quotients of the voltage differences and the current differences, utilizing the characteristic values for a time interval to determine an interval characteristic value, and determining of the amount of charge which can be drawn from the storage battery from at least one interval characteristic value for at least one time interval.

BRIEF DESCRIPTION OF THE DRAWINGS

The invention will be explained in more detail in the following text using the attached drawings, in which.

DETAILED DESCRIPTION OF THE PREFERRED AND EXEMPLARY EMBODIMENTS

Figure 1:
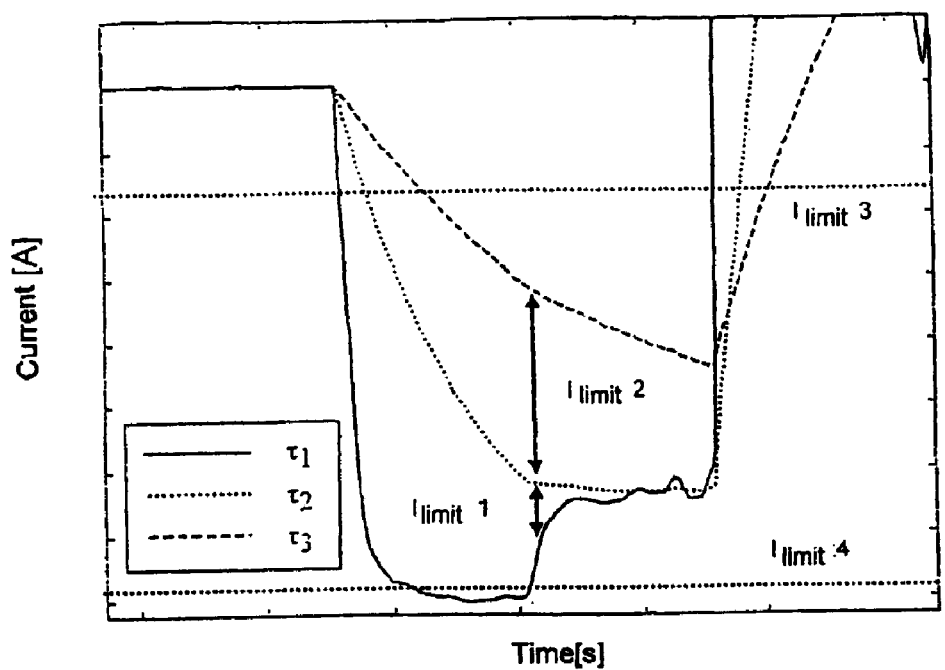
FIG. 1 shows a diagram of battery current profiles which are filtered using different time constants and which shows defined limit values.

According to an exemplary embodiment of the present invention, a method for determining the amount of charge which can be drawn from a storage battery includes determining a battery voltage profile and a battery current profile over at least one time interval; smoothing the battery voltage profile U(t) and the battery current profile I(t) using at least two different smoothing measures; and determining the voltage differences $\Delta U_{23}(t)$ between the battery voltages smoothed using a second smoothing measure and the battery voltages smoothed using a third smoothing measure, with the third smoothing measuring producing greater smoothing than the second smoothing measure. The method also includes determining the current differences $\Delta I_{23}(t)$ between the battery currents smoothed using a second smoothing measure and the battery currents smoothed using a third smoothing measure, with the third smoothing measure producing greater smoothing than the second smoothing measure. The method further includes calculating characteristic values from quotients of the voltage differences and from the current differences, utilizing the characteristic values for a time interval to determine an interval characteristic value, and determining the amount of charge which can be drawn from the storage battery from at least one interval characteristic value for at least one time interval.

It has been found that a relatively simple evaluation by determination or calculation of measured battery voltages and battery currents (e.g., generation of battery voltage or current profiles) of a storage battery during operation can be used to determine the amount of charge which can be drawn. This is achieved by suitably smoothing the battery voltages and battery currents to produce a reference voltage and a reference current by choosing a long time constant as the smoothing measure, using which the difference from the battery current and battery voltage smoothed using a shorter time constant can be assessed. This can be done by continuously measuring and evaluating by calculation the battery voltage and battery currents over at least one time interval.

The smoothing is preferably carried out by filtering using time constants, by averaging, in particular with a sliding average or the like.

The calculated characteristic values are preferably used to calculate a mean value as the interval characteristic value. The mean value may also be a sliding average or median, etc.

It is advantageous for the characteristic values to be calculated or to be used to determine the interval characteristic value only when certain conditions are satisfied. The amount of charge which can be drawn is thus determined only on the basis of permissible characteristic values.

One condition may be for the magnitude of current difference $\Delta I_{23}(t)$ to be less than a defined second limit value. Alternatively or additionally to this, a further condition may be that the magnitude of the current difference $\Delta I_{12}(t)$ of the battery current smoothed using the second smoothing measure and the battery current smoothed using a first smoothing measure is less than a defined first limit value, with the first smoothing measure producing greater smoothing than the second smoothing measure.

As a further condition, it is possible to provide for the battery currents smoothed using the second smoothing measure to be greater than a third limit value and less than a fourth limit value.

It is also possible to stipulate that the magnitude of the current difference $\Delta I_{23}(t)$ is greater than a defined fifth limit value and/or the magnitude of the current difference $\Delta I_{12}(t)$ of the battery current filtered using the second time constant and of the battery current filtered using a first time constant is greater than a defined sixth limit value.

The first and the second limit values are preferably in the region of the 30-hour to 80-hour current of the battery, and preferably correspond approximately to the 50-hour current. The third limit value preferably corresponds approximately to the 10-hour current and the fourth limit value corresponds approximately to the 30-hour current, with a tolerance of approximately 50% still leading to comparable results.

For lead-acid rechargeable batteries of approximately 70 ampere hours (Ah), it has been found to be advantageous to use a first limit value in the region of approximately 1 ampere (A), a second limit value in the region of approximately 1 A, a third limit value of approximately −5 A, and a fourth limit value in the region of approximately −2 A. The limit values should be regarded only as approximate guidelines, since the method depends on the type and size of the battery.

It is particularly advantageous for the permissible characteristic values which satisfy the conditions mentioned above to be integrated in one time interval. The times in which permissible characteristic values are present are likewise integrated, in order to calculate the time duration of the time interval. The interval characteristic value is then calculated as the quotient of the integrated characteristic value in the time interval, as calculated by integration of the permissible characteristic values, and the time duration of the time interval.

The interval characteristic values are preferably weighted as a function of the state of operation of the storage battery. By way of example, the weighting factors used while the storage battery is being discharged are not the same as those used when it is being charged.

It has been found to be advantageous for the amount of charge which can be drawn to be determined from the at least one interval characteristic value as a function of the state of charge of the storage battery and of the battery temperature, for example with the aid of families of characteristics which are determined empirically or by calculation, or by suitable formulae.

For practical use, it is advantageous to learn a family of characteristics for the new state interval characteristic values of a storage battery in the new state, as a function of states of charge and battery temperatures.

In order to determine the amount of charge which can be drawn from a storage battery during operation, a measurement coefficient J is then calculated from an interval characteristic value for a determined state of charge and a measured battery temperature, and from the learned new state interval characteristic value for the determined state of charge and the measured battery temperature. The amount of charge which can be drawn is then determined as a function of the measurement coefficient J, the state of charge, and the battery temperature. The interval characteristic values are thus evaluated with reference to new state interval characteristic values.

The measurement coefficient J may, for example, be the difference between or the ratio of the interval characteristic value and the new state interval characteristic value.

The method according to the invention makes it possible to determine the amount of charge $Q_R$ which can be drawn from a storage battery by evaluation of the current and voltage profiles which can be measured during operation of the storage battery.

For this purpose, the battery voltage U(t) and the battery current I(t) are measured with a suitable time resolution, preferably of less than 1 second (s), and the battery voltage values or profiles U(t) and the battery current values or profiles I(t) are smoothed, for example, using at least two low-pass filters with different time constants $\tau$. The second time constant $\tau_2$ should in this case be shorter than the third time constant $\tau_3$. The smoothing can also be carried out by averaging, for example sliding averaging over different time windows, or the like. FIG. 1 shows corresponding battery current profiles smoothed using different time constants $\tau$.

Voltage differences $\Delta U_{23}(t)$ are then calculated for one time interval in each case from the difference between the battery voltages U(t) filtered using the second time constant $\tau_2$ and the battery voltages U(t) filtered using the third time constant $\tau_3$. In the same way, the current differences $\Delta I_{23}(t)$ are calculated from the difference between the battery currents I(t) filtered using the second time constant $\tau_2$ and the battery currents I(t) filtered using the third time constant $\tau_3$.

A characteristic value K(t) is then calculated from the quotient of the voltage differences $\Delta U_{23}(t)$ and the current differences $\Delta I_{23}(t)$ as a function of the time, in each case limited to the time intervals $\Delta t$. An interval characteristic value Km is calculated, preferably by averaging, from the characteristic values K(t) for in each case one time interval $\Delta t$, and the amount of charge $Q_R$ which can be drawn is determined as a function of the interval characteristic value Km. This will be clearer from the following equations:

$$Q_R(\Delta t) = f(Km(\Delta t)) = f\left(\frac{1}{T}\int \frac{(U_{\tau 3}(t) - U_{\tau 2}(t))}{(I_{\tau 3}(t) - I_{\tau 2}(t))} dt\right)$$

The process of determining the amount of charge $Q_R$ which can be drawn is in this case based only on permissible characteristic values K(t) which satisfy at least one of the following conditions: a) the magnitude of the current difference $\Delta I_{12}(t)$ between the battery current I(t) filtered using the second time constant $\tau_2$ and the battery current I(t) filtered using a first time constant $\tau_1$ is less than a defined first limit value $I_{limit1}$; b) the magnitude of the current difference $\Delta I_{23}(t)$ is less than a defined second limit value $I_{limit2}$; and c) the battery currents I(t) filtered using the second time constant $\tau_2$ are greater than a defined third limit value $I_{limit3}$ and less than a defined fourth limit value $I_{limit4}$.

Optionally, it is also possible to stipulate that the magnitude of the current difference $\Delta I_{23}(t)$ is greater than a defined fifth limit value $I_{limit5}$, and the magnitude of the current difference $\Delta I_{12}(t)$ is greater than a defined sixth value $I_{limit6}$.

The conditions can be expressed by the following equation:

$$I_{limit\,5} < |I_{\tau 3}(t) - I_{\tau 2}(t)| < I_{limit\,2}$$

$$I_{limit\,6} < |I_{\tau 3}(t) - I_{\tau 1}(t)| < I_{limit\,2}$$

$$I_{limit\,3} < I_{\tau 2}(t) < I_{limit\,4}$$

For starter lead-acid rechargeable batteries with a size of 70 Ah, it has been found to be advantageous to use orders of magnitude for the first limit value of $I_{limit1}=1$ A, for the second limit value of $I_{limit2}=1$ A, for the third limit value of $I_{limit3}=-5$ A, and for the fourth limit value of $I_{limit4}=-2$ A. The current limit values themselves are dependent on both the battery size and its type.

FIG. 1 shows a diagram of battery current values I(t) smoothed using a first time constant $\tau_1$, a second time constant $\tau_2$, and a third time constant $\tau_3$, plotted against time, with defined limit values $I_{limit1}$, $I_{limit2}$, $I_{limit3}$ and $I_{limit4}$. As can be seen, the definition of the limit values means that the characteristic value K can be determined essentially only in the central and rear area of the first decaying flank of the current pulse, since this is the only place where the limit value conditions are satisfied.

Figure 2:
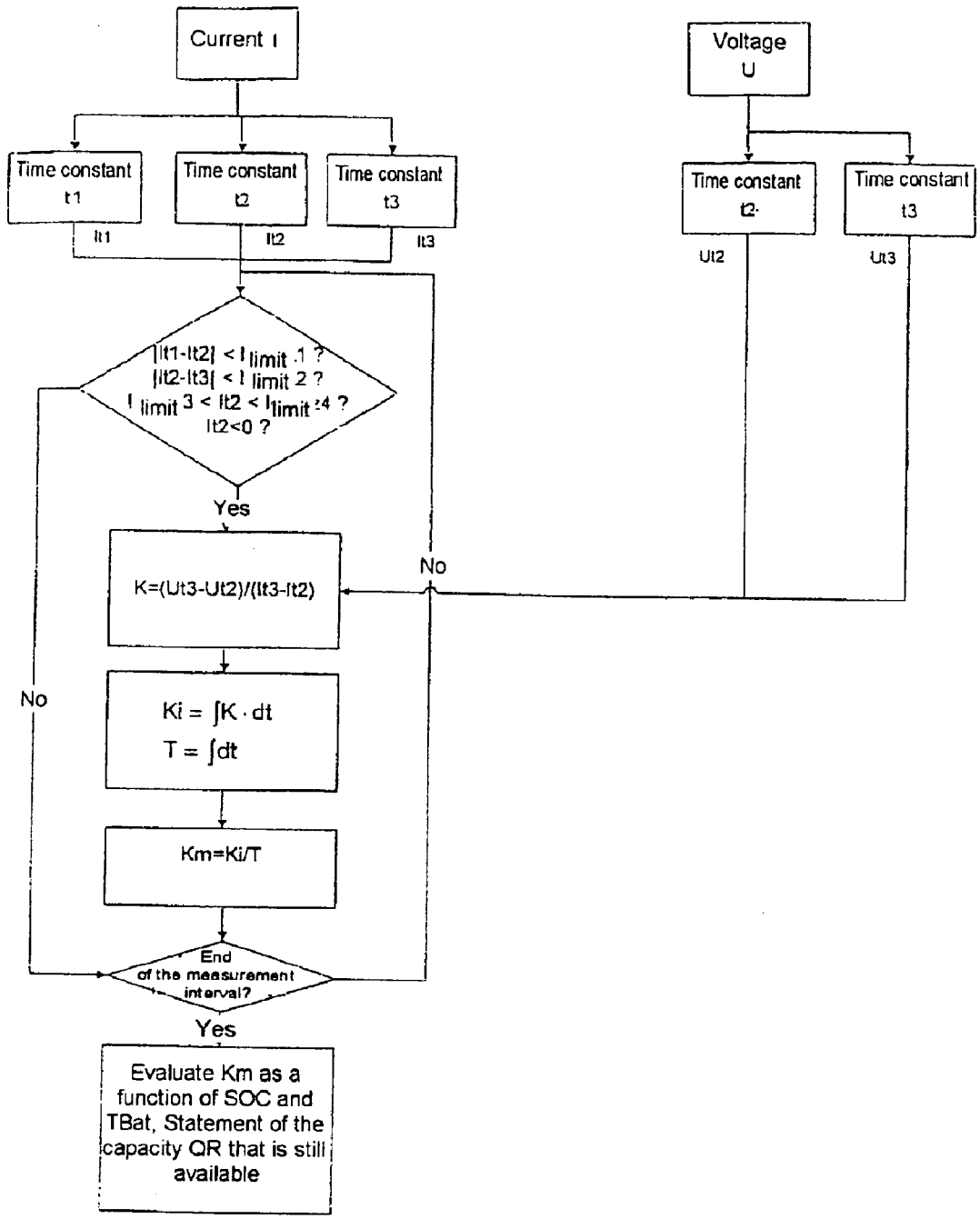
FIG. 2 shows a flowchart of a method according to an exemplary embodiment for determining the amount of charge which can be drawn.

FIG. 2 shows one possible flowchart for the method according to the invention for determining the amount of charge $Q_R$ which can be drawn. In this case, the evaluation process is restricted to those times in which the battery is being discharged.

This clearly shows that the battery currents I(t) are filtered using three low-pass filters with different time constants $\tau_1$, $\tau_2$, $\tau_3$. A check is carried out to determine whether the filtered current value $I_{\tau 1}(t)$, $I_{\tau 2}(t)$, $I_{\tau 3}(t)$ satisfies the conditions described above, that is to say whether:

$$|I_{\tau 1} - I_{\tau 2}| < I_{limit\,1}$$

$$|I_{\tau 2} - I_{\tau 3}| < I_{limit\,2}$$

$$I_{limit\,3} < I_{\tau 2} < I_{limit\,4}$$

$$I_{\tau 2} < 0$$

If this is the case, the damped current values I(t) and the voltage values $U_{\tau 2}(t)$ and $U_{\tau 3}(t)$ damped using a low-pass filter with a second time constant $\tau_2$ and a low-pass filter with a third time constant $\tau_3$ are used to calculate a characteristic value K(t) from the formula:

$$K(t) = \frac{(U_{\tau 3}(t) - U_{\tau 2}(t))}{(I_{\tau 3}(t) - I_{\tau 2}(t))}$$

An integrated characteristic value Ki $$Ki = \int K \cdot dt$$

is determined, for example by integration, from the characteristic values K(t) for a time interval $\Delta t$, and the time duration T of the time interval are calculated by integration of the times in which the conditions are satisfied.

$$T = \int dt$$

The interval characteristic value $$Km = \frac{Ki}{T}$$

is then calculated as the mean value of the permissible characteristic values K(t).

The interval characteristic value Km is assessed at the end of a time interval Δt, preferably as a function of the state of charge SOC and of the battery temperature $T_{Bat}$, and the amount of charge $Q_R$ which can be drawn is determined.

The amount of charge $Q_R$ which can be drawn can be determined with the aid of the predetermined families of characteristics, which are determined empirically or by calculation, as a function of the state of charge SOC and of the battery temperature $T_{Bat}$.

If the relationship between the state of charge and the battery temperature $T_{Bat}$ is known, it is also possible to correct the characteristic value K(t) appropriately. It is also worthwhile weighting the characteristic value K(t) as a function of the situation in which the storage battery is being operated. For example, time intervals Δt in which the storage battery is being charged can be weighted differently than time interval Δt in which the battery is being discharged.

In order to make it possible to use the interval characteristic value Km to deduce the amount of charge $Q_R$ which can be drawn, a new value interval characteristic value $Km_{new}$ is preferably determined as a function of the states of charge SOC and battery temperatures $T_{Bat}$, and is defined as a characteristic value. This can be determined by learning a family of characteristics.

A measurement coefficient J is then determined during operation from the difference between or the ratio of the interval characteristic value Km and the new value interval characteristic value $Km_{new}$ for the respectively existing states of charge SOC and battery temperatures $T_{Bat}$. The new value interval characteristic values $Km_{new}$ are thus compared with the determined interval characteristic values Km for the same state of charge SOC and battery temperature $T_{Bat}$. The amount of charge $Q_R$ which can be drawn is then determined as a function of the state of charge SOC, of the battery temperature $T_{Bat}$ and of the measurement coefficient J, for example with the aid of families of characteristics.

Figure 3:
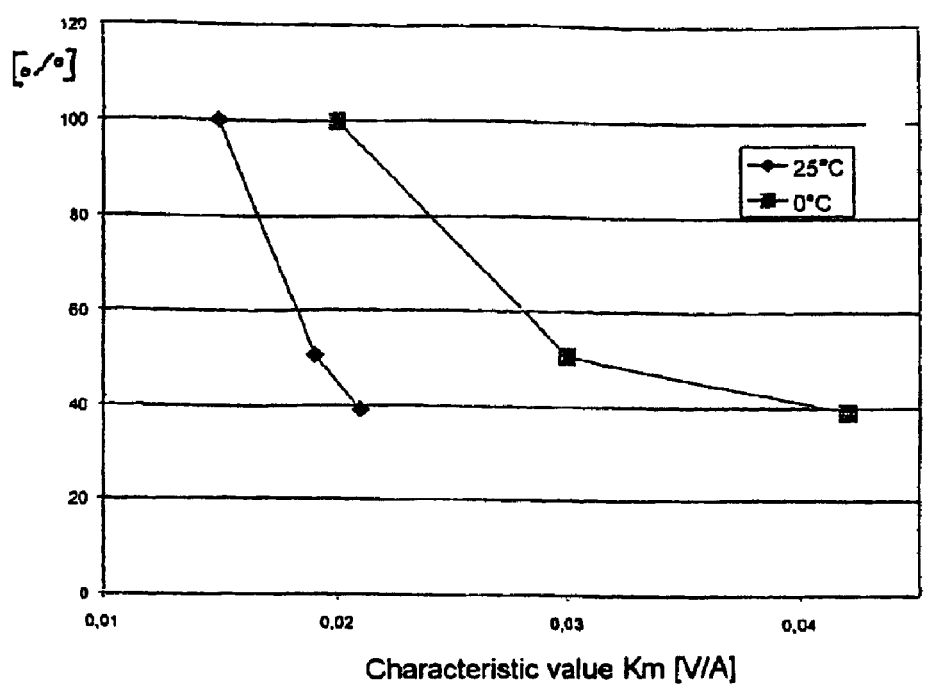
FIG. 3 shows a diagram of the amount of charge which can be drawn plotted against the interval characteristic value for two different temperatures.

FIG. 3 shows a diagram of a starter battery with a size of 70 Ah to show the amount of charge $Q_R$ which can be drawn, plotted against the characteristic value Km, as a function of the battery temperature $T_{Bat}$ of 0° and 25°. The state of charge SOC is 70%.

This clearly shows that there is a unique relationship between the amount of charge $Q_R$ which can be drawn and the characteristic value Km, provided that the battery temperature $T_{Bat}$ and the state of charge SOC are known. Corresponding families of characteristics can be determined for further states of charge SOC and battery temperatures $T_{Bat}$, and can be stored. This data can be then be used as the basis for using the interval characteristic values Km, which have been calculated using the method according to the invention as described above, to determine the amount of charge $Q_R$ which can be drawn.

It is important to note that the method as described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. Other substitutions, modifications, changes and omissions may be made in the design, operating conditions and arrangement of the preferred and other exemplary embodiments without departing from the scope of the present inventions.

What is claimed is:

1. A method for determining the amount of charge which can be drawn from a storage battery comprising:
    determining a battery voltage profile and a battery current profile over at least one time interval;
    smoothing the battery voltage profile and the battery current profile using at least two different smoothing measures;
    determining voltage differences between the battery voltage profile smoothed using a second smoothing measure and the battery voltage profile smoothed using a third smoothing measure, with the third smoothing measure producing greater smoothing than the second smoothing measure;
    determining current differences between the battery current profile smoothed using a second smoothing measure and the battery current profile smoothed using a third smoothing measure, with the third smoothing measure producing greater smoothing than the second smoothing measure;
    calculating characteristic values from quotients of the voltage differences and the current differences;
    utilizing the characteristic values for a time interval to determine an interval characteristic value; and
    determining of the amount of charge which can be drawn from the storage battery from at least one interval characteristic value for at least one time interval.

2. The method of claim 1 wherein the smoothing is carried out by filtering with different time constants, with a second time constant as a second smoothing measure being greater than a third time constant as a third smoothing measure.

3. The method of claim 1 wherein the smoothing is at least partially carried out by averaging.

4. The method of claim 1 further comprising utilizing a mean value of the characteristic values of a time interval in order to calculate the interval characteristic value for the time interval.

5. The method of claim 1 wherein the characteristic values are used for determination of the interval characteristic value only when the magnitude of the current difference is less than a defined second limit value.

6. The method of claim 5 wherein the second limit value is in the region of the 30-hour to 80-hour current of the storage battery.

7. The method of claim 5 wherein the second limit value corresponds approximately to the 50-hour current of the storage battery.

8. The method of claim 5 wherein the characteristic values are used for determination of the interval characteristic value only when the magnitude of the current difference of the battery current smoothed using the second smoothing measure and of the battery current smoothed using a first smoothing measure is less than a defined first limit value, with the first smoothing measure producing greater smoothing than the second smoothing measure.

9. The method of claim 8 wherein the first limit value is in the region of the 30-hour to 80-hour current of the storage battery.

10. The method of claim 8 wherein the first limit value corresponds approximately to the 50-hour current of the storage battery.

11. The method of claim 1 wherein the characteristic values are used for determination of the interval characteristic value only when the battery currents smoothed using the second smoothing measure are greater than a third limit value and are less than a fourth limit value.

12. The method of claim 11 wherein the third limit value is approximately the 10-hour current and the fourth limit value is approximately the 30-hour current of the storage battery.

13. The method of claim 1 further comprising integrating permissible characteristic values in a time interval to calculate an integrated characteristic value for the time interval, integrating the times in which permissible characteristic values are present to determine a time period for the time interval and to calculate the interval characteristic value as the quotient of the integrated characteristic value of the time interval and the time period.

14. The method of claim 13 further comprising weighting the interval characteristic values as a function of a state of operation of the storage battery.

15. The method of claim 1 further comprising determining the amount of charge which can be drawn from the storage battery from at least one interval characteristic value as a function of a state of operation of the storage battery.

16. The method of claim 15 further comprising determining the amount of charge which can be drawn from the storage battery from at least one interval characteristic value as a function of at least one of the state of charge of the storage battery and the battery temperature.

17. The method of claim 14 wherein the relationship between the amount of charge which can be drawn and the interval characteristic values, the state of charge and the battery temperature are described using families of characteristics which are determined empirically or by calculation.

18. The method of claim 1 further comprising:
learning a family of characteristics to determine new state interval characteristic values for a storage battery in a new state as a function of states of charge and battery temperatures;
calculating a measure coefficient from an interval characteristic value for a determined state of charge and a determined battery temperature and from the new state interval characteristic value for the state of charge and the battery temperature; and
determining the amount of charge which can be drawn from the storage battery as a function of the measure coefficient, the state of charge, and the battery temperature.

19. The method of claim 18 wherein the measure coefficient is the difference between the interval characteristic value and the new state interval characteristic value.

20. The method of claim 18 wherein the measure coefficient is the ratio of the interval characteristic value and the new state interval characteristic value.

21. A monitoring device for a storage battery comprising:
a measurement component for measuring battery voltages and battery currents; and
an evaluation component, wherein the evaluation component is designed to carry out a method comprising:
determining a battery voltage profile and a battery current profile over at least one time interval;
smoothing the battery voltage profile and the battery current profile using at least two different smoothing measures;
determining voltage differences between the battery voltage profile smoothed using a second smoothing measure and the battery voltage profile smoothed using a third smoothing measure, with the third smoothing measure producing greater smoothing than the second smoothing measure;
determining current differences between the battery current profile smoothed using a second smoothing measure and the battery current profile smoothed using a third smoothing measure, with the third smoothing measure producing greater smoothing than the second smoothing measure;
calculating characteristic values from quotients of the voltage differences and the current differences;
utilizing the characteristic values for a time interval to determine an interval characteristic value; and
determining of the amount of charge which can be drawn from the storage battery from at least one interval characteristic value for at least one time interval.

* * * * *